(12) United States Patent
Gurusami et al.

(10) Patent No.: US 6,411,235 B1
(45) Date of Patent: Jun. 25, 2002

(54) DYNAMIC RANGE EXTENSION WITH GAIN CORRECTION

(75) Inventors: Aravanan Gurusami, Wallingford; Joseph F. Chiappetta, Shelton; Niranjan Samant, Middletown; Donald T. Wesson, Ashford, all of CT (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 41 days.

(21) Appl. No.: 09/602,747

(22) Filed: Jun. 23, 2000

(51) Int. Cl.$^7$ ................................................ H03M 1/62
(52) U.S. Cl. ...................................................... 341/139
(58) Field of Search ................................. 341/139, 155, 341/144

(56) References Cited

U.S. PATENT DOCUMENTS 5,630,221 A * 5/1997 Birleson ...................... 341/139
6,292,120 B1 * 9/2001 Painchaud .................. 341/139

\* cited by examiner

Primary Examiner—Brian Young
(74) Attorney, Agent, or Firm—Fogg Slifer Polglaze Leffert & Jay, P.A.

(57) ABSTRACT

A method for controlling gain in a network is provided. The method includes receiving signals for transmission over a network and adjusting the level of the received signals. The method further includes inserting an additional signal indicative of the level adjustment and transmitting the signals and the additional signal over the network. The method also includes extracting the additional signal after transmission over the network and compensating for the level adjustment based on the extracted signal.

31 Claims, 1 Drawing Sheet

DYNAMIC RANGE EXTENSION WITH GAIN CORRECTION

RELATED APPLICATIONS

This application is related to co-pending application Ser. No. 09/517,685 filed on Mar. 2, 2000, entitled "Automatic Gain Control for input to Analog to Digital Converter" (the "'685 Application"). This application is also related to co-pending application Ser. No. 09/599,701, filed on Jun. 22, 2000, entitled "Automatic Level Control for Input to Analog to Digital Converter" (the "'701 Application"). The '685 and the '701 Applications are incorporated by reference.

TECHNICAL FIELD

The present invention relates generally to the field of electronics and, in particular, to automatic level control for an input to an analog to digital converter.

BACKGROUND

Linear Amplifiers, analog to digital (A/D) converters, and analog laser transmitters are used in a wide variety of communication circuits. For example, A/D converters are used in high frequency digital transmission systems that receive analog input signals. The A/D converter is an electronic circuit that receives the analog input signal and produces a digital output signal. The digital output signal is produced based on samples of the analog input signal taken over time and processed through a plurality of output registers. The A/D converter samples the digital signal based on a clock signal. In high-speed applications for digital transmission systems, these clock signals typically operate at speeds in the tens to hundreds of megahertz range.

A/D converters and other circuits, such as amplifiers and laser transmitters, typically found in communication circuits have a limited dynamic range in that the circuits are designed to process analog signals over a specified range of values. In an A/D converter, when the input signal exceeds the specified peak input signal level, the output registers of the A/D converter overflow. This occurs even when the input voltage exceeds the peak input level by a value that would cause the A/D converter output to exceed its maximum level by a single least significant bit. Further increases beyond this point produce spurious output signals (distortions) that are proportional to the degree of overload of the A/D converter's output registers. Similar distortions are produced when an amplifier or a linear laser transmitter is driven beyond its optimum linear range (which is known as the compression point in linear systems). The spurious signals can be detrimental to the operation of the devices using the communication network. However, if this overload is kept at sufficiently low levels in terms of amplitude and frequency of occurrence, then the resultant distortion can be acceptable in many applications; but operating too far below the optimum drive point reduces the signal to noise ratio of the communication network and degrades the performance. Thus for best performance, it is necessary to operate near the optimum point while not exceeding it. Such an operation does not leave much room for overdrive condition necessitating expensive high linearity devices or automatic gain control mechanisms as described below.

To reduce the effect of overflow conditions, some electronic systems are adjusted to operate well below the peak input voltage range of the A/D converter and other electronic circuits with limited dynamic range. When initially setting up the system, the input voltage is increased gradually while the circuit is monitored, e.g., by an overflow register of the A/D converter. In the case of a typical AID converter, when an overflow condition is reached, the A/D converter provides an output of narrow pulses from the overflow register. The frequency of occurrence of the pulses is typically proportional to the severity of the overflow. Based on the monitored output of the overflow register, the input to the A/D converter is adjusted, e.g., by setting an attenuator, such that the expected maximum input signal will not exceed the peak input range of the A/D converter. In some systems, this adjustment is set at or near 50% of the peak input voltage level. Unfortunately, this reduces the effectiveness of the A/D converter and reduces the signal to noise ratio for the electronic device.

In some circuits, it is desirable to maintain the peak input voltage of the analog signal at or near the maximum value for the range of input signals accepted by the devices with a limited dynamic range, e.g., an analog to digital converter. Thus, automatic gain control circuits have been used in conjunction with circuits including analog to digital converters, amplifiers and laser transmitters. Typically, the automatic gain control circuit monitors the input to the device with the limited dynamic range. The automatic gain control circuit further generates a feedback signal based on the monitored input signal. The feedback signal is provided to an amplifier to control the level of the input signal to the analog to digital converter. This feedback signal attempts to keep the peak voltage level of the input signal at or near the full-scale value of the input for the analog to digital converter.

Conventionally, the feedback signal for A/D converters is generated using analog circuitry. For example, such feedback loops typically include one or more of the following analog control blocks: a log amplifier, a summing amplifier, an integrator, and a differentiator. Unfortunately, these analog feedback control loops typically suffer from the so-called "clip" effect. This means that when the input signal exceeds the full-scale input for the analog to digital converter, the control circuitry is unable to quickly reach steady-state operation. Some control loops attempt to use digital circuitry to overcome these problems.

Automatic gain or level control for circuits that have a limited dynamic range may introduce other problems into transmission systems. When automatic level control is used, total gain from system input to system output may vary over time as a function of input signal level. In some transmission systems, devices coupled to the transmission system expect a substantially constant or uniform gain from the system. For example, cable modems coupled to hybrid fiber/coax (HFC) networks include circuitry that is designed to monitor and adjust for changes in gain in the HFC network. Thus, as the automatic level control circuit attempts to compensate for an increasing input from a cable modem, the modem responds by further increasing its output provided to the network. Such a course of events can have disastrous consequences.

For the reasons stated above, and for other reasons stated below which will become apparent to those skilled in the art upon reading and understanding the present specification, there is a need in the art for improvements in automatic level or gain control that extend the dynamic range of circuits without compromising the operation of associated circuits and systems.

SUMMARY

The above-mentioned problems with automatic gain control in telecommunications systems and other problems are addressed by the present invention and will be understood by reading and studying the following specification. Embodiments of the present invention provide information on gain adjustments in circuitry associated with a transmitter to circuitry associated with a receiver to produce offsetting gain adjustments at the receiver. Advantageously, the use of this "dual gain control" produces a channel with a substantially constant gain function while allowing the dynamic range of circuitry associated with the transmitter to be extended.

More particularly, in one embodiment a method for controlling gain in a network is provided. The method includes receiving signals for transmission over a network and adjusting the level of the received signals. The method further includes inserting an additional signal indicative of the level adjustment and transmitting the signals and the additional signal over the network. The method also includes extracting the additional signal after transmission over the network and compensating for the level adjustment based on the extracted signal.

DETAILED DESCRIPTION

Figure 1:
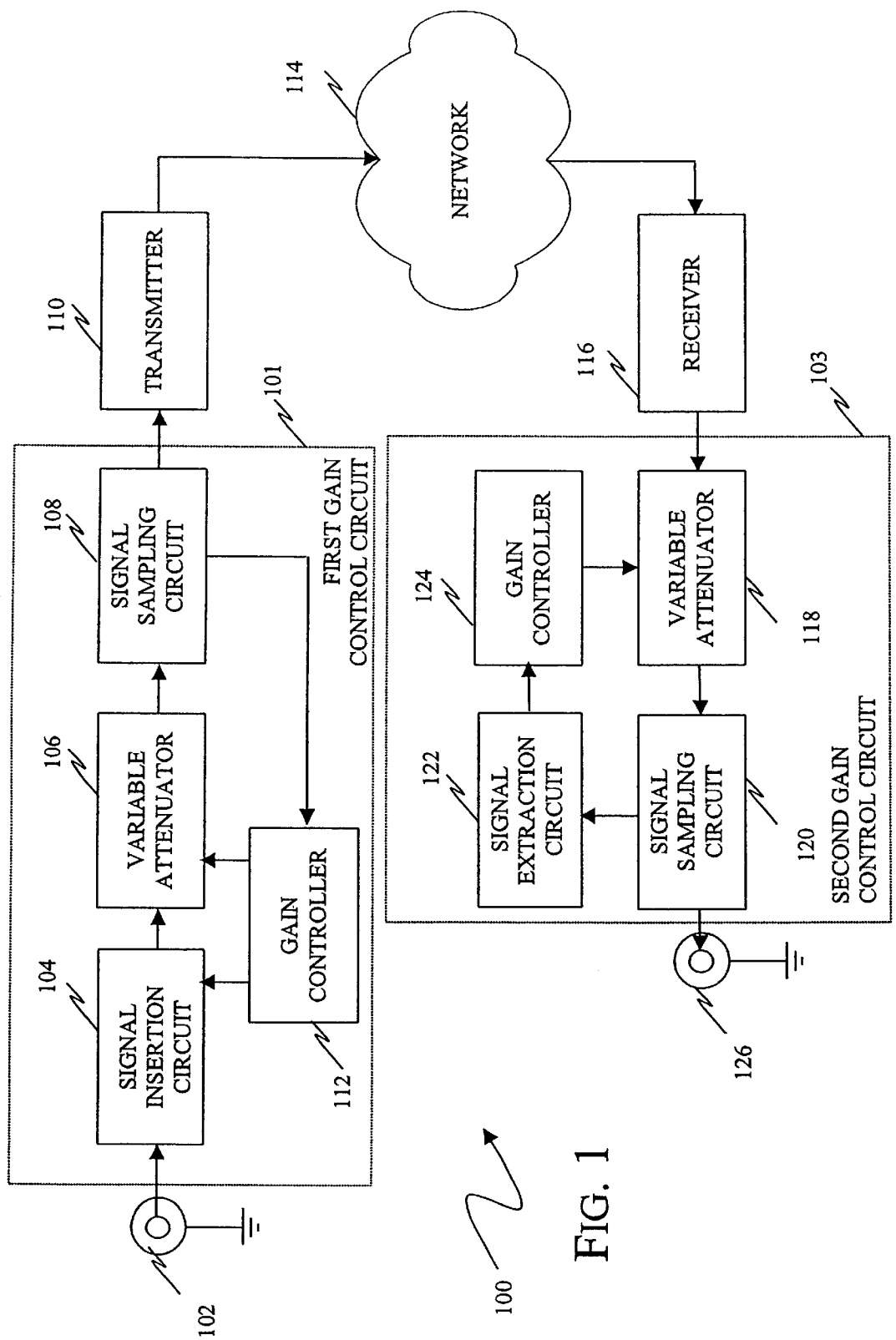
FIG. 1 is a block diagram of an embodiment of a telecommunications system that uses a gain correction circuit at a receiver to compensate for adjustments of an automatic gain control circuit associated with a transmitter according to the teachings of the present invention.

In the following detailed description, reference is made to the accompanying drawings, which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

FIG. 1 is a block diagram of an embodiment of a telecommunications system, indicated generally at 100, including first and second gain control circuits 101 and 103 that implement a counter-acting dual gain control function to produce a substantially constant gain channel over network 114 between input 102 and output 126 according to the teachings of the present invention. This allows system 100 to advantageously improve the performance of circuits with limited dynamic range without adversely impacting or limiting the effectiveness of circuits providing input to system 100. First and second gain control circuits 101 and 103 are described in detail below.

First gain control circuit 101 is coupled between input 102 and transmitter 110. Transmitter 110 is coupled to network 114. Transmitter 110 includes circuitry or devices with a limited dynamic range. For example, in some embodiments, transmitter 110 is a digital transmitter with an analog to digital (A/D) converter with a limited dynamic range. In other embodiments, transmitter 100 includes circuits such as A/D converters, amplifiers, laser transmitters and the like that have a limited dynamic range.

In one embodiment, network 114 comprises a hybrid fiber/coax network. In other embodiments, network 114 comprises other appropriate networks for transmitting data, e.g., voice, video, or high-speed data. Network 114 also provides an output to receiver 116. Second gain control circuit 103 is coupled between receiver 116 and output 126.

For simplicity in describing the functionality of telecommunications system 100, FIG. 1 illustrates a unidirectional connection from input 102 to output 126. However, it is understood, that telecommunications system 100 is not limited to a unidirectional network. Rather, bidirectional communication is accomplished over network 114 by providing complementary pairs of first and second gain control circuits 101 and 103 at each point connecting to network 114 thus allowing bidirectional communication with each direction including counter-acting dual gain control to produce substantially constant gain on both channels between endpoints.

First gain control circuit 101 is adapted to receive signals at input 102 for transmission over network 114. First gain control circuit 101 includes the series combination of signal insertion circuit 104, variable attenuator 106, and signal sampling circuit 108. First gain control circuit 101 further includes gain controller 112. Gain controller 112 is coupled to receive a feedback signal from signal sampling circuit 108. Gain controller 112 further provides input to variable attenuator 106 and signal insertion circuit 104.

In one embodiment, gain controller 1 12 instructs signal insertion circuit 104 to insert a message with the signals receive at input 102 for transmission over network 114. This message indicates the level of gain of gain controller 112. This message is used by second gain control circuit 103 to compensate for the gain of first gain control circuit 101 as described in more detail below. In another embodiment, signal insertion circuit 104 inserts a reference signal with the signals received at input 102. In this embodiment, the effect of variable attenuator 106 is communicated to second gain control circuit 103 by the inserted reference signal. Essentially, second gain control circuit 103 learns the setting of variable attenuator 106 based on the received reference signal from first gain control circuit 101.

In one embodiment, first gain control circuit 101 implements an automatic level control procedure such as the procedure described in co-attending, commonly assigned application Ser. No. 09/599,701 incorporated by reference above. In one embodiment, variable attenuator 106 comprises a plurality of PIN diodes coupled in either a "T," a "pi" or other appropriate configuration to produce an acceptable attenuation for signals provided to transmitter 110. In other embodiments, variable attenuator 106 comprises a variable gain amplifier(current or voltage controlled), a digital scaling circuit or other appropriate circuit with an adjustable gain for adjusting the level of signals to be transmitted over network 114. Thus, the terms "gain" and "attenuation" are used interchangeably to indicate a change in the magnitude of signals transmitted over network 114. Further, it is understood that these terms also include a unity gain.

Second gain control circuit 103 is coupled between receiver 116 and output 126. Second gain control circuit 103 includes the series combination of variable attenuator 118 and signal sampling circuit 120. Second gain control circuit 103 further includes signal extraction circuit 122 and gain controller 124. Signal extraction circuit 122 is coupled to signal sampling circuit 120. Signal extraction circuit 122 provides an input to gain controller 124. This input is based on the signal inserted into first gain control circuit 101 by signal insertion circuit 104. Gain controller 124 provides a control input, based on the extracted signal, to variable attenuator 118 to adjust the gain of second gain control circuit 103 to counter-act the gain of gain control circuit 101. In one embodiment gain controller 124 implements an inverse gain function to compensate for the gain of first gain control circuit 101.

In one embodiment, variable attenuator 118 comprises a plurality of PIN diodes coupled in either a "T," a "pi" or other appropriate configuration to produce an acceptable attenuation for signals from receiver 116. Again, the term "attenuation" encompasses attenuation, gain, and unity gain. In other embodiments, variable attenuator 118 comprises a variable gain amplifier (current or voltage controlled), a digital scaling circuit or other appropriate circuit with an adjustable gain.

Advantageously, the use of first and second gain control circuits 101 and 103 allows system 100 to extend the dynamic range of various components of system 100, e.g., transmitter 110, while producing a channel in network 114 with substantially constant gain between input 102 and output 126.

In operation, system 100 provides transport of data over network 114 with substantially constant gain between input 102 and output 126. The signals are received at input 102 from, for example, a cable modem or other appropriate data source. First gain control circuit 101 adjusts the gain of the signals received at input 102 to compensate for the limited dynamic range of devices associated with transmitter 110. For example, gain controller 112 adjusts the gain of variable attenuator 106 to set the peak level of input signals to an A/D converter for transmitter 110 at or substantially near the peak level acceptable by the A/D converter as described in the U.S. application Ser. No. 09/599,201 incorporated by reference above.

The amount of gain or attenuation implemented by variable attenuator 106 is communicated to second gain control circuit 103 via a signal inserted by signal insertion circuit 104. In one embodiment, signal insertion during 104 inserts a reference signal for transmission to second gain control circuit 103. This reference signal passes through variable attenuator 106 and thus carries information on the gain of variable attenuator 106. In another embodiment, signal insertion circuit 104 inserts a message from gain controller 112 to indicate the level of gain or attenuation implemented by variable attenuator 106.

At second gain control circuit 103, signals received over network 114 are compensated for the gain or attenuation of first gain control circuit 101. Gain controller 124 controls the gain of variable attenuator 118 based on a signal extracted by signal extraction circuit 122. Essentially, gain controller 124 causes variable attenuator 118 to implement a counter-acting gain to compensate for the gain of variable attenuator 106. Thus, system 100 provides a dual gain control function that provides a communication channel over network 114 between input 102 and output 126 that has a substantially constant gain.

CONCLUSION

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, in other embodiments, circuits other than PIN diodes are used to implement the variable attenuator function. Further, networks other than hybrid fiber/coax networks are used in other embodiments of system 100.

What is claimed is:

1. A gain control system, the system comprising:
   an input adapted to be coupled to a network;
   a variable attenuator responsive to the input;
   a signal extraction circuit, responsive to the variable attenuator, that extracts a signal indicative of level control imposed on signals transmitted over the network; and
   a gain controller, responsive to the signal extraction circuit, that generates a control signal for the variable attenuator to compensate for the level control on the signals received over the network.

2. The system of claim 1, wherein the input is adapted to be coupled to a hybrid fiber/coax network.

3. The system of claim 1, wherein the variable attenuator comprises at least one of a plurality of PIN diodes, or a variable gain amplifier, or a digital scaling circuit.

4. The system of claim 1, wherein the signal extraction circuit extracts a reference signal from the output of the variable attenuator.

5. The system of claim 1, wherein the signal extraction circuit extracts a message indicative of the level of adjustment by the automatic level control circuit.

6. The system of claim 1, wherein the gain controller establishes a current for the variable attenuator.

7. The system of claim 1, and further including a receiver coupled between the input and the variable attenuator.

8. The system of claim 1, wherein the gain controller implements an inverse of the level control imposed on signals transmitted over the network.

9. A gain control system, comprising:
   an input adapted to receive signals for transmission over a network;
   an insertion circuit, responsive to the input, that inserts an additional signal for transmission over the network;
   a variable attenuator, responsive to the insertion circuit, that adjusts the level of signals for transmission over the network;
   a gain controller, responsive to an output of the variable attenuator, that provides a feedback control signal to the variable attenuator to set a gain of the variable attenuator; and
   wherein the signal inserted by the insertion circuit indicates the gain of the variable attenuator to allow for compensation of the effect of the variable attenuator on the signals after transmission over the network.

10. The system of claim 9, wherein the input is adapted to receive signals from a modem for transmission over a hybrid fiber/coax network.

11. The system of claim 9, wherein the variable attenuator comprises at least one of a plurality of PIN diodes, or a variable gain amplifier, or a digital scaling circuit.

12. The system of claim 9, wherein the insertion circuit inserts a reference signal.

13. The system of claim 9, wherein the insertion circuit inserts a message indicative of the level of the variable attenuator.

14. The system of claim 9, wherein the gain controller establishes a current for the variable attenuator.

15. The system of claim 1, and further including a transmitter coupled to the variable attenuator.

16. A method for controlling gain in a network, the method comprising:
   receiving signals over a network;
   extracting a signal indicative of a level of gain control associated with a transmitter;
   compensating for the gain control associated with the transmitter based on the extracted signal.

17. The method of claim 16, wherein receiving signals over a network comprises receiving signals over a hybrid fiber/coax network.

18. The method of claim 16, wherein receiving signals over a network comprises receiving digital signals generated from an analog signal, wherein the analog signal is compensated for a peak input level of an analog to digital converter prior to transmission over the network.

19. The method of claim 16, wherein extracting a signal comprises extracting a reference signal from the received signal.

20. The method of claim 16, wherein extracting a signal comprises extracting a message indicating a level of gain for circuitry associated with a transmitter.

21. The method of claim 16, wherein compensating for the gain level comprises generating a gain that is the inverse of the gain associated with the transmitter.

22. A transmission system, comprising:

an input adapted to receive signals for transmission, a first gain control circuit, responsive to the input, that selectively adjusts the level of the received signals and inserts an additional signal indicative of the level of gain control of the first gain control circuit;

a transmitter, responsive to the first gain control circuit, that transmits the received signals;

a network, responsive to the transmitter, that transports the signals from the transmitter;

a second gain control circuit, responsive to the network, that implements a gain function based on the inserted additional signal to counteract the gain control of the first gain control circuit so as to provide a channel with a substantially constant gain; and an output, responsive to the second gain control circuit.

23. The system of claim 22, wherein the first gain control circuit includes:

an insertion circuit, responsive to the input, that inserts the additional signal for transmission over the network;

a variable attenuator, responsive to the insertion circuit, that adjusts the level of signals for transmission over the network;

a gain controller, responsive to an output of the variable attenuator, that provides a feedback control signal to the variable attenuator to set a gain of the variable attenuator; and wherein the signal inserted by the insertion circuit indicates the gain of the variable attenuator.

24. The system of claim 22, wherein the second gain control circuit includes:

a variable attenuator responsive to the network;

a signal extraction circuit, responsive to the variable attenuator, that extracts a signal indicative of gain of the first gain control circuit; and a gain controller, responsive to the signal extraction circuit, that generates a control signal for the variable attenuator to counteract the gain control of the first gain control circuit so as to provide a channel with a substantially constant gain.

25. The system of claim 22, wherein the first gain control circuit inserts a reference signal.

26. The system of claim 22, wherein the first gain control circuit inserts a message indicative of the gain of the first gain control circuit.

27. A method for controlling gain in a network, the method comprising:

receiving signals for transmission over a network;

adjusting the level of the received signals;

inserting an additional signal indicative of the level adjustment;

transmitting the signals and the additional signal over the network;

extracting the additional signal after transmission over the network;

compensating for the level adjustment based on the extracted signal.

28. The method of claim 27, wherein transmitting signals over a network comprises transmitting signals over a hybrid fiber/coax network.

29. The method of claim 27, wherein extracting the additional signal comprises extracting a reference signal from the received signal.

30. The method of claim 27, wherein extracting the additional signal comprises extracting a message indicating a level of gain prior to transmission.

31. The method of claim 27, wherein compensating for the level adjustment comprises generating a gain that is the inverse of a gain prior to transmission.

* * * * *